(12) United States Patent
Inoue et al.

(10) Patent No.: US 7,816,172 B2
(45) Date of Patent: Oct. 19, 2010

(54) ORGANIC THIN-FILM TRANSISTOR AND FABRICATION METHOD THEREOF AND ORGANIC THIN-FILM DEVICE

(75) Inventors: Youji Inoue, Tokyo (JP); Shizuo Tokito, Tokyo (JP); Masafumi Kobayashi, Shibukawa (JP); Yuan Gao, Shibukawa (JP)

(73) Assignee: Kanto Denka Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/589,800

(22) PCT Filed: Feb. 17, 2005

(86) PCT No.: PCT/JP2005/002495

§ 371 (c)(1),
(2), (4) Date: Aug. 17, 2006

(87) PCT Pub. No.: WO2005/078816

PCT Pub. Date: Aug. 25, 2005

(65) Prior Publication Data

US 2007/0194302 A1 Aug. 23, 2007

(30) Foreign Application Priority Data

Feb. 18, 2004 (JP) .............................. 2004-041397

(51) Int. Cl.
*H01L 51/30* (2006.01)
*H01L 51/40* (2006.01)
(52) U.S. Cl. .................... 438/99; 257/40; 257/E51.049
(58) Field of Classification Search .................. 257/40, 257/E51.001–E51.052; 438/99

See application file for complete search history.

(56) References Cited

U.S. PATENT DOCUMENTS

| 6,403,397 | B1 * | 6/2002 | Katz ........................... 438/99 |
| 6,891,237 | B1 * | 5/2005 | Bao et al. .................... 257/410 |
| 2003/0054586 | A1 * | 3/2003 | Shtein et al. .................. 438/99 |
| 2003/0105365 | A1 * | 6/2003 | Smith et al. .................. 568/774 |
| 2005/0095450 | A1 * | 5/2005 | Begley et al. ................ 428/690 |
| 2006/0192482 | A1 * | 8/2006 | Igarashi et al. .............. 313/504 |

OTHER PUBLICATIONS

Suzuki, T., et al, "K10.53 Perfluorinated Oligothiophenes and Pentacene as n-Type Semiconductors for Organic Field-Effect Transistors", Symposium K: Functional Organic Materials and Devices Fall 2003 Program, Materials Research Society, 2003.*

(Continued)

*Primary Examiner*—Matthew W Such
(74) *Attorney, Agent, or Firm*—Ladas & Parry LLP

(57) ABSTRACT

An organic thin-film transistor having a higher carrier-mobility, a method of fabricating the organic thin-film transistor and an organic thin-film device including the organic thin-film transistor are provided. In an organic thin-film transistor having an organic semiconductor layer, the organic semiconductor layer contains a fluorinated acene compound which is represented by a formula of $C_{4n+2}F_{2n+4}$, wherein n is an integer of 2 or greater. The fluorinated acene compound is preferably tetradecafluoropentacene or dodecafluoronaphthacene.

3 Claims, 3 Drawing Sheets

OTHER PUBLICATIONS

Sakamoto, Y., et al, "Synthesis of Perfluorinated Tetracene and Pentacene and Applications for Organic Field-Effect Transistors", Annual Review 2003, Institute for Molecular Sciences, Published Feb. 2004. http://www.ims.ac.jp/publications/ann_rev_2003/index.html.*

Schon, J.H., et al. "Ambipolar Pentacene Field-Effect Transistors and Inverters", Science, vol. 287, pp. 1022-1023, Feb. 11, 2000.*

Sakamoto, Y., et al. "Perfluoropentacene: High-Performance p-n Junctions and Complementary Circuits with Pentacene." J. Am. Chem. Soc., vol. 126 (2004): pp. 8138-8140.*

Dimitrakopoulos, C.D., et al. "Molecular Beam Deposited Thin Films of Pentacene for Organic Field Effect Transistor Applications." J. Appl. Phys., vol. 80, No. 4 (Aug. 15, 1996): pp. 2501-2508.*

Sakamoto, Y. et al. "Perfluorinated Oligothiophenes and Pentacene as n-Type Semiconductors for Organic Filed-Effect Transistors" *Proc. MRS Fall Meeting* (2003) K10.52.

Gundlach, D.J. et al. "Thin-Film Transistors Based on Well-Ordered Thermally Evaporated Naphthacene Films" *Applied Physics Letters* (2002) vol. 80, No. 16, pp. 2925-2927.

Malenfant, P. et al. "N-type Organic Thin-film Transistor with High Field-effect Mobility Based on a N,n'-dialkyl-3,4,9,10-perylene Tetracarboxylic Diimide Derivative" *Applied Physics Letters* (2002) vol. 80, No. 14, pp. 2517-2519.

Katz, H.E. et al. "A Soluble and Air-Stable Organic Semiconductor with High Electron Mobility" *Nature* (2000) vol. 404, pp. 478-480.

Bao, Z. et al. "New Air-Stable n-Channel Organic Thin Film Transistors" *J. Am. Chem. Soc.* (1998) vol. 120, No. 1, pp. 207-208.

Lin, Y.Y. et al. "Stacked Pentacene Layer Organic Thin-Film Transistors with Improved Characteristics" *IEEE Electron Device Letters* (1997) vol. 18, No. 12, pp. 606-608.

* cited by examiner

ORGANIC THIN-FILM TRANSISTOR AND FABRICATION METHOD THEREOF AND ORGANIC THIN-FILM DEVICE

TECHNICAL FIELD

The present invention relates to an organic thin-film transistor and a method of fabricating an organic thin-film transistor and an organic thin-film device.

BACKGROUND ART

In recent years, a study or development for utilizing an organic compound as a semiconductor material has been actively conducted and a study intended for utilizing a material of organic compound instead of a conventional device based on silicon is also being paid attention to in the field of a thin-film transistor (Thin Film Transistor; TFT), which has been frequently used for a logic element or a switching element. Since it is easier to process an organic compound compared to silicon as an inorganic substance, it is expected that a low-cost device can be realized by utilizing an organic compound as a semiconductor material. Also, a variety of substrates, which include a plastic substrate, can be used in regard to a semiconductor device utilizing an organic compound, since it is possible to produce the device at temperature of 100° C. or lower. Further, it is expected to realize a flexible device by using a plastic substrate and a semiconductor material of organic compound in combination, since the semiconductor material of organic compound is structurally flexible.

A typical organic TFT has a substrate, a gate electrode, a gate insulating film, an organic semiconductor layer, a source electrode and a drain electrode. In such an organic TFT, a gate electrode and a gate insulating film are provided on a substrate and the gate electrode is covered with the gate insulating film. An organic semiconductor layer is provided on the gate insulating film and a source electrode and a drain electrode are provided on the organic semiconductor layer. Also, the source electrode and the drain electrode lie adjacent at a small spacing on the organic semiconductor layer. Herein, since the electrical conductivity of the organic semiconductor layer between the source electrode and the drain electrode is changed when a voltage applied to the gate electrode is changed, the electric current flowing between the source electrode and the drain electrode can be controlled by adjusting the gate voltage.

Also, various organic compounds have been suggested for a semiconductor material used for an organic TFT. For example, low-molecular-weight materials such as copper phthalocyanine and pentacene, origomeric materials such as α-sexithiophene, and polymeric materials such as poly(alkylthiophene) have been reported.

Among these materials, acene compounds such as naphthacene and pentacene are known as p-type organic semiconductor materials having an excellent characteristic. These acene compounds are organic compounds of planar molecule having a spread π-electronic system. Then, a thin film can be formed in which plural planar molecules of the acene compound are oriented such that the molecular axes of the molecules are parallel to each other. As a result, π-electronic orbitals of the plural molecules of the acene compound mutually overlap in the directions perpendicular to the molecular planes thereof and the mobility of carriers in the organic semiconductor material is large in the directions perpendicular to the molecular planes. For example, a high hole-mobility of 0.1 $cm^2V^{-1}s^{-1}$ has been reported in regard to a p-type organic TET having an organic semiconductor layer made of naphthacene (for example, see D. J. Gundlach et al., Appl. Phys. Lett., Vol. 80, pp. 2925-2927 (2002)). Also, a hole-mobility of 1 $cm^2V^{-1}s^{-1}$ or greater, which is the highest among organic semiconductors, is obtained at room temperature in regard to a p-type organic TFT having an organic semiconductor layer made of pentacene (for example, see Y. Y. Lin et al., IEEE Electron Device Letters, Vol. 18, No. 12, pp. 606-608 (1997)). Particularly, the hole-mobility of the p-type organic TFT having an organic semiconductor layer made of pentacene is comparable to or greater than an electron-mobility of amorphous silicon, which has been widely used for a liquid crystal display.

On the other hand, as an n-type organic semiconductor material, fluorinated copper phthalocyanine, naphthalenetetracarbodiimide derivatives, perylene derivatives, etc., are ever known. However, it is difficult to obtain an n-type organic TFT having a high electron-mobility compared to an electron-mobility of amorphous silicon using these materials (for example, see Z. Bao et al., J. Am. Chem., Soc., Vol. 120, pp. 207-208 (1998), H. E. Katz et al., Nature, Vol. 404, pp. 478-480 (2000), and P. R. L. Malenfant et al., Appl. Phys. Lett., Vol. 80, pp. 2517-2519 (2002)).

Accordingly, an organic semiconductor material having a high electron-mobility is also desired in regard to an n-type organic TFT. In order to obtain an n-type organic semiconductor material having a high electron-mobility, it is required to obtain an organic compound of planar molecule having a spread π-electronic system similar to pentacene, which is a p-type organic semiconductor material having a high hole-mobility.

Also, as described above, many of organic semiconductors composed of planar molecules having such a spread π-electronic system have different carrier-mobilities depending on the orientations of these plural planar molecules and the orientations of these planar molecules influence the conductivity of carriers in a thin film of organic semiconductor. For example, in regard to pentacene having a π-electronic system which is a p-type organic semiconductor material, it is known that a p-type organic semiconductor material composed of pentacene has a high hole-mobility in the directions perpendicular to the molecular planes of the molecules by orienting the pentacene so that π-electronic orbitals of the pentacene mutually overlap in the directions perpendicular to the molecular planes thereof. Similarly, in order that an n-type organic semiconductor material has a high electron-mobility in the directions perpendicular to the molecular planes of molecules which compose the organic semiconductor material, it is preferable to orient these planar molecules so that π-electronic orbitals of the plural planar molecules mutually overlap in the directions perpendicular to the molecular planes thereof. That is, in order to improve the electron-mobility of an n-type organic TFT, an n-type organic semiconductor material for an active layer in the organic TFT is preferably a thin film having a good crystallizability and an orientation property of a molecule of an organic semiconductor material, similar to those of pentacene which is a p-type organic semiconductor material.

DISCLOSURE OF THE INVENTION

Problems to be Solved by the Invention

The object of the present invention is to provide an organic thin-film transistor having a higher carrier-mobility, a method of fabricating the organic thin-film transistor and an organic thin-film device including the organic thin-film transistor.

Means for Solving the Problem

The first aspect of the present invention is an organic thin-film transistor having an organic semiconductor layer, characterized in that the organic semiconductor layer contains a fluorinated acene compound which is represented by a formula of $C_{4n+2}F_{2n+4}$, wherein n is an integer of 2 or greater.

According to the first aspect of the present invention, an organic thin-film transistor having a higher carrier-mobility can be provided since the organic semiconductor layer contains a fluorinated acene compound which is represented by a formula of $C_{4n+2}F_{2n+4}$, wherein n is an integer of 2 or greater.

The second aspect of the present invention is an organic thin-film transistor composed of a gate electrode, a source electrode, a drain electrode, a gate insulating film, and an organic semiconductor layer, characterized in that the organic semiconductor layer contains a fluorinated acene compound which is represented by a formula of $C_{4n+2}F_{2n+4}$, wherein n is an integer of 2 or greater.

According to the second aspect of the present invention, an organic thin-film transistor having a higher carrier-mobility can be provided since the organic semiconductor layer contains a fluorinated acene compound which is represented by a formula of $C_{4n+2}F_{2n+4}$, wherein n is an integer of 2 or greater.

The third aspect of the present invention is an organic thin-film transistor according to the first or second aspect of the present invention, characterized in that plural molecules of the fluorinated acene compound are oriented so that molecular axes of the molecules are approximately parallel to each other and a normal direction of a molecular plane of the molecule approximately corresponds to a direction of electric current flowing in the organic semiconductor layer. Herein, the molecular axes of the molecules being approximately parallel to each other includes the case where the molecular axes of the plural molecules of the fluorinated acene compound are regarded as being substantially parallel to each other in addition to the case where the molecular axes of the plural molecules of the fluorinated acene compound are completely parallel to each other. Also, approximately corresponding to the direction of electric current flowing in the organic semiconductor layer includes the case where the normal direction of the molecular planes of the plural molecules of the fluorinated acene compound is regarded as substantially corresponding to the direction of electric current flowing in the organic semiconductor layer in addition to the case where the normal direction of the molecular planes of the plural molecules of the fluorinated acene compound completely correspond to the direction of electric current flowing in the organic semiconductor layer.

According to the third aspect of the present invention, an organic thin-film transistor having a further higher carrier-mobility can be provided since plural molecules of the fluorinated acene compound are oriented so that molecular axes of the molecules are approximately parallel to each other and a normal direction of a molecular plane of the molecule approximately corresponds to a direction of electric current flowing in the organic semiconductor layer.

The fourth aspect of the present invention is an organic thin-film transistor according to any of the first through third aspects of the present invention, characterized in that the fluorinated acene compound is tetradecafluoropentacene.

According to the fourth aspect of the present invention, an organic thin-film transistor having a higher carrier-mobility can be more reliably provided since the fluorinated acene compound is tetradecafluoropentacene.

The fifth aspect of the present invention is an organic thin-film transistor according to any of the first through third aspects of the present invention, characterized in that the fluorinated acene compound is dodecafluoronaphthacene.

According to the fifth aspect of the present invention, an organic thin-film transistor having a higher carrier-mobility can be more reliably provided since the fluorinated acene compound is dodecafluoronaphthacene.

The sixth aspect of the present invention is a method of fabricating an organic thin-film transistor having a substrate and an organic semiconductor layer, characterized in that the organic semiconductor layer is formed by controlling temperature of the substrate to 30° C. or higher and 65° C. or lower and vacuum-depositing tetradecafluoropentacene on the substrate.

According to the sixth aspect of the present invention, a method of fabricating an organic thin-film transistor having a higher carrier-mobility can be provided since the organic semiconductor layer is formed by controlling temperature of the substrate to 30° C. or higher and 65° C. or lower and vacuum-depositing tetradecafluoropentacene on the substrate.

The seventh aspect of the present invention is a method of fabricating an organic thin-film transistor having a substrate and an organic semiconductor layer, characterized in that the organic semiconductor layer is formed by controlling temperature of the substrate to 24° C. or higher and 60° C. or lower and vacuum-depositing dodecafluoronaphthacene on the substrate.

According to the seventh aspect of the present invention, a method of fabricating an organic thin-film transistor having a higher carrier-mobility can be provided since the organic semiconductor layer is formed by controlling temperature of the substrate to 24° C. or higher and 60° C. or lower and vacuum-depositing dodecafluoronaphthacene on the substrate.

The eighth aspect of the present invention is an organic thin-film device characterized by including an organic thin-film transistor according to any of the first through fifth aspects of the present invention.

According to the eighth aspect of the present invention, an organic thin-film device can be provided which includes an organic thin-film transistor having a higher carrier-mobility since an organic thin-film transistor according to any of the first through fifth aspects of the present invention is included.

The ninth aspect of the present invention is an organic thin-film device according to the eighth aspect of the present invention, characterized by including the organic thin-film transistor which constitutes an n-type thin-film transistor and a p-type thin-film transistor.

According to the ninth aspect of the present invention, various organic thin-film devices can be provided which includes an n-type organic thin-film transistor having a higher carrier-mobility and a p-type thin-film transistor since the organic thin-film transistor which constitutes an n-type thin-film transistor and a p-type thin-film transistor are included.

The tenth aspect of the present invention is an organic thin-film device according to the ninth aspect of the present invention, characterized in that the p-type thin-film transistor has an organic semiconductor layer which contains pentacene.

According to the tenth aspect of the present invention, an organic thin-film device can be provided which includes an n-type organic thin-film transistor having a higher carrier-mobility and a p-type thin-film transistor having a high carrier-mobility since the p-type thin-film transistor has an organic semiconductor layer which contains pentacene.

Advantageous Effect of the Invention

According to the present invention, an organic thin-film transistor having a higher carrier-mobility, a method of fabricating the organic thin-film transistor and an organic thin-film device including the organic thin-film transistor can be provided.

Figure 1:
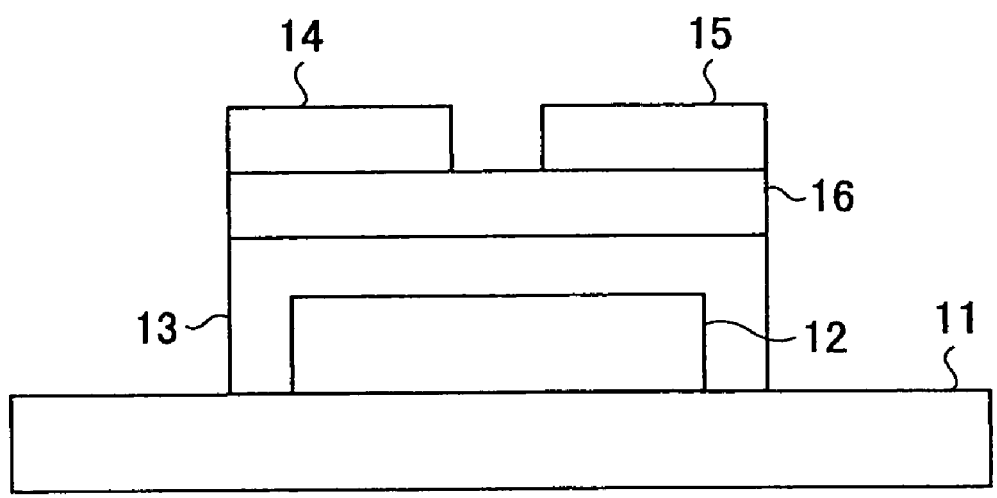
FIG. 1 is a cross-section diagram illustrating one aspect of an organic thin-film transistor of the present invention.

EXPLANATION OF LETTERS OR NUMERALS 11 substrate
12 gate electrode
13 gate insulating film
14 source electrode
15 drain electrode
16 organic semiconductor layer

BEST MODE FOR CARRYING OUT THE INVENTION

Next, embodiments of the present invention are described with reference to the drawings.

First, an organic thin-film transistor according to the present invention is described. The organic thin-film transistor according to the present invention has an organic semiconductor layer. The organic semiconductor layer contains a fluorinated acene compound. Herein, a fluorinated acene compound is a compound represented by a formula of $C_{4n+2}F_{2n+4}$, wherein n is an integer of 2 or greater. That is, a fluorinated acene compound is a compound in which all of hydrogen atoms of an acence compound are replaced by fluorine atoms. Herein, an acene compound represents a hydrocarbon compound in which two or more benzene rings are linearly fused. As specific examples of the fluorinated acene compound, there can be provided octafluoronaphthalene (n=2, $C_{10}F_8$), decafluoroanthracene (n=3, $C_{14}F_{10}$), dodecafluoronaphthacene (n=4, $C_{18}F_{12}$), tetradecafluoropentacene (n=5, $C_{22}F_{14}$), hexadecafluorohexacene (n=6, $C_{26}F_{16}$), and octadecafluoroheptacene (n=7, $C_{30}F_{18}$), etc. n is preferably 10 or less.

Such a fluorinated acene compound is an organic compound of a planar molecule having an extended π-electronic system. Thus, since the fluorinated acene compound is a planar molecule having an extended π-electronic system, π-electronic orbitals of plural molecules of fluorinated acene compound mutually overlap, whereby carrier-mobility among these plural molecules of fluorinated acene compound can be improved. Particularly, when plural molecules of fluorinated acene compound are oriented such that molecular axes (a long axis, short axis and normal axis of a molecular plane) of the plural molecules of fluorinated acene compound are approximately parallel to each other, that is, such that molecular planes of the plural molecules of fluorinated acene compound approximately-parallel-overlap, the overlap of π-electronic orbitals of the plural molecules of fluorinated acene compound can be enhanced. As a result, the carrier-mobility among the plural molecules of fluorinated acene compound can be more improved. Additionally, the term "approximately parallel" in the claims and the specification includes to be substantially regarded as being parallel as well as to be perfectly parallel.

Also, when plural molecules of fluorinated acene compound are oriented such that molecular axes of the plural molecules of fluorinated acene compound are approximately aligned and the normal line of a molecular plane of the molecule of fluorinated acene compound (directions perpendicular to the molecular plane) is approximately aligned with the direction of current flowing in an organic semiconductor layer, the mobility of a carrier flowing in the organic semiconductor layer can be further improved. For example, when plural molecules of fluorinated acene compound are oriented such that molecular planes of the molecules of fluorinated acence compound are approximately parallel to each other and long axes of the molecules of fluorinated acene compound are directed to directions which are approximately perpendicular to a surface of a substrate for an organic thin-film transistor, π-electronic orbitals of these plural molecules overlap along directions which are approximately parallel to the surface of the substrate and carriers generated in the organic semiconductor layer can comparatively easily move along the directions which are approximately parallel to the surface of the substrate. Additionally, the term "being approximately aligned" in the claims and the specification includes to be substantially regarded as being aligned as well as to be perfectly aligned.

Thus, According to the present invention, an organic thin-film transistor having a high carrier-mobility (field-effect mobility) can be provided.

Furthermore, in regard to a fluorinated acene compound, since hydrogen atoms of an acene compound are replaced by fluorine atoms having electronegativity higher than that of a hydrogen atom, π-electron density of a fluorinated acence compound is smaller than π-electron density of an acene compound due to the electron-withdrawing properties of fluorine atoms. Accordingly, a fluorinated acene compound has an electron accepting property higher than that of an acence compound and has electron conductivity. That is, carriers moving through a fluorinated acene compound are electrons and a fluorinated acene compound is preferably used as an n-type organic semiconductor material. Therefore, a fluorinated acene compound can have a larger electron-mobility and an n-type organic thin-film transistor having a high electron-mobility can be provided by using a fluorinated acene compound as a material for an organic semiconductor layer.

Specifically, for example, an organic thin-film transistor having an organic semiconductor layer made of tetradecafluoropentacene as a fluorinated acene compound is an n-type organic thin-film transistor and exhibits an electron-mobility of 0.1 cm$^2$/Vs or greater and an on/off ratio of current flowing in the organic semiconductor (current flowing between a source electrode and a drain electrode) of $10^4$ or greater. That is, an organic thin-film transistor having an organic semiconductor layer containing a fluorinated acene compound can be an n-type organic thin-film device having a high carrier-mobility comparable to or greater than that of a p-type thin-film transistor having an organic semiconductor layer made of an acene compound such as naphthacene and pentacene.

Herein, the fluorinated acence compound is preferably tetradecafluoropentacene ($C_{22}F_{14}$). That is, the fluorinated acene compound is a compound represented by a formula of

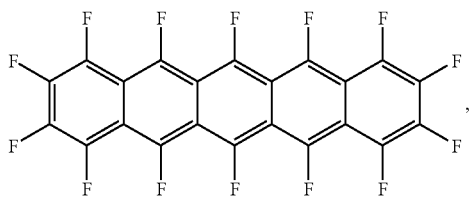

wherein this compound is a compound of n=5 among compounds represented by a formula of $C_{4n+2}F_{2n+4}$. The fluorinated acene compound is tetradecafluoropentacene, whereby an organic thin-film transistor having a high carrier-mobility can be more reliably provided.

Additionally, when an organic thin-film transistor having an organic semiconductor layer made of tetradecafluoropentacene as a fluorinated acene compound is fabricated, the organic semiconductor layer is formed, preferably, by controlling the temperature of a substrate for the organic thin-film transistor to 30° C. or higher and 65° C. or lower and vacuum-depositing tetradecafluoropentacene on the substrate. Herein, to vacuum-deposit tetradecafluoropentacene on a substrate includes both to directly vacuum-deposit tetradecafluoropentacene on a surface of a substrate so as to directly form a thin film of tetradecafluoropentacene on the surface of the substrate and to from another layer on a surface of a substrate and subsequently vacuum-deposit tetradecafluoropentacene on a surface of the another layer formed on the substrate so as to form a thin film of tetradecafluoropentacene on the surface of the another layer formed on the substrate. Thus, an organic semiconductor layer in which plural molecules of tetradecafluoropentacene are comparatively uniformly oriented can be obtained by controlling the temperature of a substrate for an organic thin-film transistor to 30° C. or higher and 65° C. or lower and vacuum-depositing tetradecafluoropentacene on the substrate so that an organic semiconductor layer made of tetradecafluoropentacene is formed. Also, in this case, molecular planes of plural molecules of tetradecafluoropentacene are approximately parallel to each other and a longer axis of the molecule of tetradecafluoropentacene is directed to directions which are approximately perpendicular to a surface of a substrate for an organic thin-film transistor. Therefore, an organic thin-film transistor having a high carrier-mobility can be fabricated.

Also, the fluorinated acence compound is preferably dodecafluoronaphthacene ($C_{18}F_{12}$). That is, the fluorinated acene compound is a compound represented by a formula of

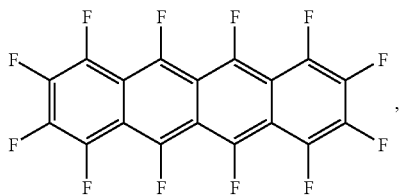

wherein this compound is a compound of n=4 among compounds represented by a formula of $C_{4n+2}F_{2n+4}$. The fluorinated acene compound is dodecafluoronaphthacene, whereby an organic thin-film transistor having a high carrier-mobility can be more reliably provided.

Additionally, when an organic thin-film transistor having an organic semiconductor layer made of dodecafluoronaphthacene as a fluorinated acene compound is fabricated, the organic semiconductor layer is formed, preferably, by controlling the temperature of a substrate for the organic thin-film transistor to 24° C. or higher and 60° C. or lower and vacuum-depositing dodecafluoronaphthacene on the substrate. Herein, to vacuum-deposit dodecafluoronaphthacene on a substrate includes both to directly vacuum-deposit dodecafluoronaphthacene on a surface of a substrate so as to directly form a thin film of dodecafluoronaphthacene on the surface of the substrate and to from another layer on a surface of a substrate and subsequently vacuum-deposit dodecafluoronaphthacene on a surface of the another layer formed on the substrate so as to form a thin film of dodecafluoronaphthacene on the surface of the another layer formed on the substrate. Thus, an organic semiconductor layer in which plural molecules of dodecafluoronaphthacene are comparatively uniformly oriented can be obtained by controlling the temperature of a substrate for an organic thin-film transistor to 24° C. or higher and 60° C. or lower and vacuum-depositing dodecafluoronaphthacene on the substrate so that an organic semiconductor layer made of dodecafluoronaphthacene is formed. Also, in this case, molecular planes of plural molecules of dodecafluoronaphthacene are approximately parallel to each other and a longer axis of the molecule of dodecafluoronaphthacene is directed to directions which are approximately perpendicular to a surface of a substrate for an organic thin-film transistor. Therefore, an organic thin-film transistor having a high carrier-mobility can be fabricated.

Next, one aspect of an organic thin-film transistor according to the present invention and a fabrication method thereof are described with reference to FIG. 1.

FIG. 1 is a cross-section diagram for illustrating one aspect of an organic thin-film transistor of the present invention. This organic thin-film transistor is an organic thin-film transistor called a general reverse-stagger-type structure. As shown in FIG. 1, the organic thin-film transistor according to the present invention has a substrate 11, a gate electrode 12, a gate insulating-film 13, a source electrode 14, a drain electrode 15, and an organic semiconductor layer 16. More specifically, the gate electrode 12 and the gate insulating-film 13 are provided on a surface of the substrate 11 and the gate electrode 12 is covered with the gate insulating-film 13. The organic semiconductor layer 16 is provided on the surface of the gate insulating-film 13 at the opposite side of the gate electrode 12, and the source electrode 14 and the drain electrode 15 are provided on the surface of the organic semiconductor layer at the opposite side of the gate insulating film 13. The source electrode 14 and the drain electrode 15 oppose to each other via a small gap on the surface of the organic semiconductor layer 16. The channel length and channel width of the organic semiconductor are determined depending on the size of gap between the source electrode 14 and the drain electrode 15 on the organic semiconductor layer 16.

Also, carriers move through a channel in the organic semiconductor layer 16 which channel is provided between the source electrode 14 and the drain electrode 15 in the organic thin-film transistor shown in FIG. 1. Herein, the movement of carriers through the channel formed in the organic semiconductor layer 16 can be controlled by adjusting a voltage applied to the gate electrode 12. In the organic thin-film transistor according to the present invention, carriers moving in the organic semiconductor layer are electrons since the organic semiconductor layer contains a fluorinated acene compound, and the flow of electrons (electric current) moving in the organic semiconductor layer is controlled by applying a positive voltage to the gate electrode. That is, the organic thin-film transistor according to the present invention is an n-type organic thin-film transistor.

As a general method for fabricating the organic thin-film transistor according to the present invention which is shown in FIG. 1, the organic thin-film transistor can be obtained by stacking thin films of the gate electrode 12, gate insulating-film 13, organic semiconductor layer 16 containing a fluorinated acene compound and source electrode 14 and drain electrode 15 on the substrate 11 in order.

As a material of the substrate 11, an inorganic material such as glass, quartz, silicon, metals and ceramics and an organic material such as plastics can be used. Herein, when an electrically conductive material such as metals is used as a material of the substrate 11, the substrate 11 can effect the function of a gate electrode and, therefore, the fabrication of another gate electrode 12 on the substrate 11 having the function of a gate electrode 12 can be omitted. The organic thin-film transistor according to the present invention is an MIS (metal-insulator-semiconductor)-type thin-film transistor composed of the gate electrode 12, the gate insulating-film 13, the source electrode 14, the drain electrode 15 and the organic semiconductor layer 16 containing a fluorinated acene compound. Such a MIS-type thin-film transistor exhibits a good characteristic of n-type organic thin-film transistor and can be easily fabricated at a low cost because of needing no other substrates. Also, when a plastic substrate is used as a material of the substrate 11, the entire of an organic thin-film transistor including a plastic substrate can have flexibility and, therefore, the organic thin-film transistor according to the present invention can be used in various organic thin-film devices such as driving circuits for a flexible display, IC cards such as credit cards, and ID tags adhering to and used for a commercial product. However, it is necessary for a plastic material used for the plastic substrate to be excellent in heat resistance, dimensional stability, solvent resistance, an electrical insulating property, processibility, low gas permeability, and low hygroscopicity. As such a plastic material, for example, poly(ethyleneterephthalate), poly(ethylenenaphthalate), poly(styrene), polycarbonates, polyallylates, and polyimides can be provided.

Next, as a material of the gate electrode 12, there can be provided metals such as gold, platinum, chromium, tungsten, tantalum, nickel, copper, aluminum, silver, magnesium, and calcium and alloys of these metals, and polysilicon, amorphous silicon, graphite, indium tin oxide (ITO), zinc oxide, and electrically conductive polymers. The gate electrode 12 is formed by means of a well-known method such as a vacuum deposition method, an electron beam deposition method, an RF sputtering method, and a printing method, using the material of the gate electrode 12.

Next, as a material of the gate insulting-film 13, there can be provided materials such as $SiO_2$, $Si_3N_4$, $SiON$, $Al_2O_3$, $Ta_2O_5$, amorphous silicon, polyimide resins, poly(vinylphenol) resin, poly(para-xylylene) resin, and poly(methyl methacrylate) resin. The gate insulating-film 13 is formed by means of a well-known film formation method similar to those for the gate electrode 12, while one kind of material selected from the above-mentioned materials is used, or formed by means of a well-known film formation method similar to those for the gate electrode 12, while two or more kinds of materials selected from the above-mentioned materials are mixed.

Next, the organic semiconductor layer (organic active layer) 16 is formed by means of a well-known film fabrication method such as a vacuum deposition method, using the above-mentioned fluorinated acene compound.

Finally, as materials of the source electrode 14 and drain electrode 15, there can be provided metals such as gold, platinum, chromium, tungsten, tantalum, nickel, copper, aluminum, silver, magnesium, and calcium and alloys of these metals, and materials such as polysilicon, amorphous silicon, graphite, indium tin oxide (ITO), zinc oxide, and electrically conductive polymers. The source electrode 14 and the drain electrode 15 are (preferably, simultaneously) formed by means of a well-known film formation method similar to those for the gate electrode 12, using the materials of the source electrode 14 and drain electrode 15.

Further, it is preferable to provide a moisture permeation preventing layer (gas barrier layer) on the surface of the substrate 11 at the same side of the gate electrode 12, the surface of the substrate 11 at the opposite side of the gate electrode 12, or both of them. Thus, the penetration of water content and/or oxygen in air into an organic semiconductor layer can be prevented by providing a moisture permeation preventing layer on the substrate 11. As a result, rapid reduction of the life time of the organic semiconductor layer can be prevented. As a material for such a moisture permeation preventing layer, it is preferable to use an inorganic material such as silicon nitride and silicon oxide. Also, the moisture permeation preventing layer is film-formed by the means of a well-known method such as a high-frequency sputtering method.

In addition, in an organic thin-film transistor according to the present invention, a protective layer such as a hard coat layer and an under coat layer may be provided on the substrate 11 according to needs.

Next, a method for synthesizing a fluorinated acene compound used for an organic thin-film transistor according to the present invention is described.

Generally, a fluorinated acene compound represented by a formula of $C_{4n+2}F_{2n+4}$ wherein n is an integer of 2 or greater is synthesized from a compound in which a part of hydrogen atoms of an acene compound is replaced by a fluorine atom and the residual hydrogen atom(s) of the acene compound is replaced by a functional group containing an oxygen atom. Therefore, a functional group containing an oxygen atom is introduced to a carbon atom in the skeleton of the acene compound at a desired position, according to need. Herein, the functional group containing an oxygen atom includes an oxo group (an oxygen atom of a carbonyl group), a hydroxyl group, or an alkoxy group. Next, the functional group containing an oxygen atom in the skeleton of the acene compound is replaced by two fluorine atoms through fluoridation reaction. Then, one of the two fluorine atoms is eliminated from the carbon atom of the skeleton of the acene compound to which the two fluorine atoms bond, through partial defluoridation reaction, whereby a desired fluorinated acene compound can be obtained.

Next, as an example of a synthesis method for a fluorinated acene compound, a synthesis method for tetradecafluoropentacene (perfluoropentacene) is described in more detail.

First, as shown in scheme 1,

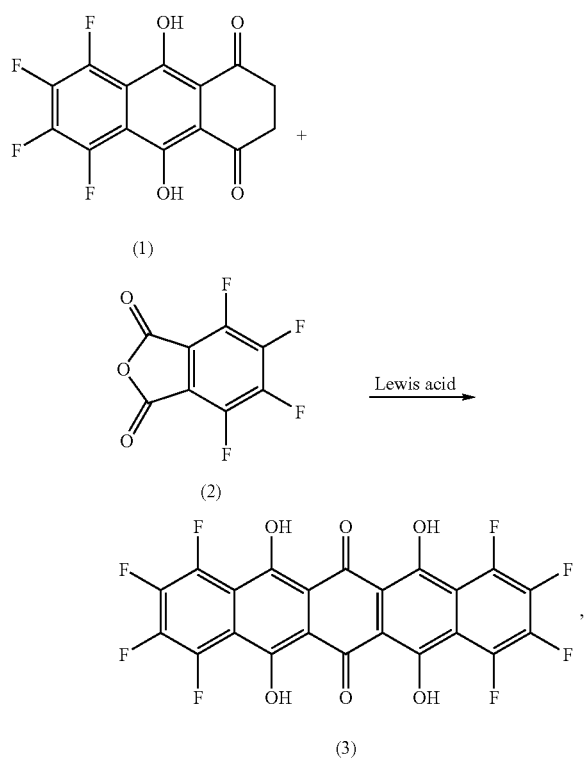

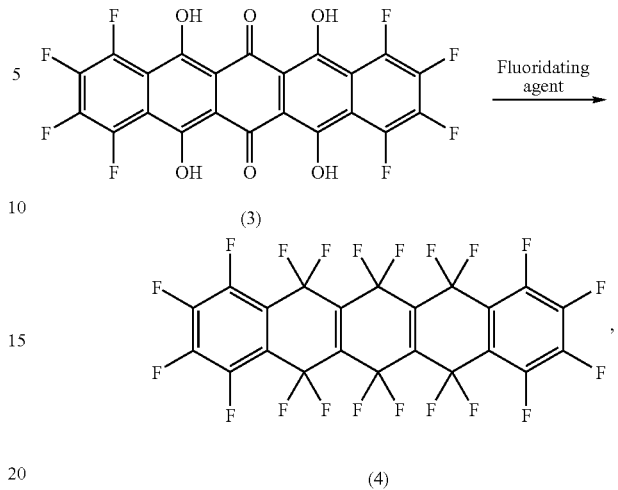

compound (1) and compound (2) are reacted under the presence of a Lewis acid so as to obtain compound (3). That is, 5,6,7,8-tetrafluoro-9,10-dihydroxyanthracene-1,4-dione (1) is reacted with 4,5,6,7-tetrafluoroisobenzfuran-1,3-dione (2) so as to obtain 1,2,3,4,8,9,10,11-octafluoro-5,7,12,14-tetrahydroxypentacene-6,13-dione (3). Additionally, the Lewis acid may be used in combination with sodium chloride.

The Lewis acid used in scheme 1 is not particularly limited and, for example, aluminum chloride, zinc chloride, iron (III) chloride, tin (IV) chloride and a boron trifluoride ether complex can be used, and aluminum chloride is preferable. The quantity of the used Lewis acid is 0.1 equivalents or more and 5.0 equivalents or less, preferably 0.2 equivalents or more and 5.0 equivalents or less, to the quantity of the raw materials. When sodium chloride is used with the Lewis acid, the quantity of the used sodium chloride is 0.1 equivalents or more and 10.0 equivalents or less, preferably 5.0 equivalents or more and 7.0 equivalents or less, to the quantity of the raw materials. The quantity of the used compound (2) is 1.0 equivalent or more and 5.0 equivalents or less, preferably 1.1 equivalents or more and 2.0 equivalents or less, to the quantity of the compound (1). The reaction temperature is 0° C. or higher and 320° C. or lower, preferably 200° C. or higher and 300° C. or lower. The reaction time is preferably 1 hour or longer and 10 hours or shorter. After the completion of the reaction, the objective compound (3) can be obtained by conducting a common post-treatment and performing purification.

Next, as shown in scheme 2 compound (3) is reacted with a fluoridating agent so that it is fluoridated so as to obtain compound (4). That is, 1,2,3,4,8,9,10,11-octafluoro-5,7,12,14-tetrahydroxypentacene-6,13-dione (3) is reacted with a fluoridating agent so as to obtain 1,2,3,4,5,5,6,6,7,7,8,9,10,11,12,12,13,13,14,14-icosafluoro-5,6,7,12,13,14-hexahydropentacene (4).

The fluoridating agent used in scheme 2 is not particularly limited and each kind of fluoride can be used, and it is preferably a fluoride of a Group 15 element or a Group 16 element, more preferably sulfur tetrafluoride. The preferable quantity of the used sulfur tetrafluoride is 4.0 times or greater and 30.0 times or less of the mole quantity of the raw materials. One of these fluoridating agents may be singularly used and the plural fluoridating agents may be used in combination. For example, a mixture of sulfur tetrafluoride and hydrogen fluoride can be used. When the reaction is carried out under pressure, hydrogen fluoride also acts as a solvent. In the fluoridation process, only the raw materials and the fluoridating agent may be used or another substance may coexist in the reaction system. As another substance coexisting in the reaction system, a substance which acts as a solvent or a catalyst can be selected. The substance acting as a solvent is not particularly limited except that it is a substance which is liquid under the reaction condition(s), and hydrogen fluoride and a fluorine-containing solvent such as dichloromethane and chloroform can be provided. When hydrogen fluoride is used, the quantity of the used hydrogen fluoride is preferably 1 mL or more and 20 mL or less to 1 g of the raw materials. The fluoridation process may be carried out at a normal pressure but, when the reaction system is heated, it is preferable to perform heating under pressure. Preferably, the reaction pressure is in a range of 0 MPa or higher and 20 MPa or lower, the reaction temperature is in a range of −40° C. or higher and 320° C. or lower, and the reaction time is in a range of 2 hours or longer and 150 hours or shorter. After the completion of the fluoridation reaction, the objective compound (4) can be obtained by conducting a common post-treatment and subsequently performing purification. As a purification method, a conventional publicly-known method can be used in which solvent extraction and recrystallization are included. In scheme 2, the objective compound (4) can be obtained by performing solvent extraction with an organic solvent such as chloroform and further performing recrystallization.

Finally, as shown in scheme 3,

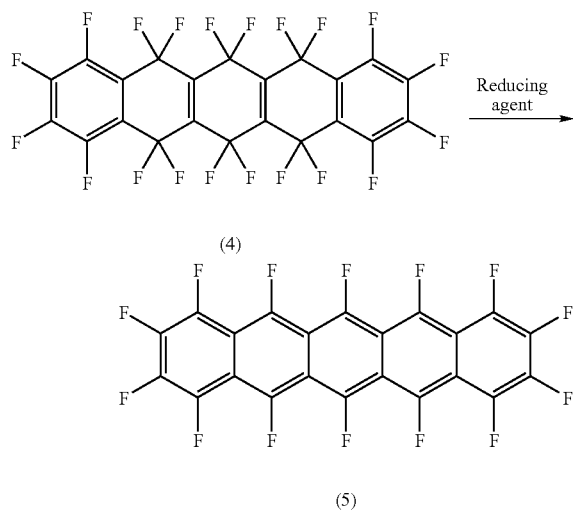

(4)

(5)

compound (4) is reacted with a reducing agent so as to obtain compound (5). That is, 1,2,3,4,5,5,6,6,7,7,8,9,10,11,12,12,13,13,14,14-icosafluoro-5,6,7,12,13,14-hexahydropentacene (4) is reacted with a reducing agent so that it is partially defluoridated so as to obtain tetradecafluoropentacene (perfluoropentacene) (5).

The reducing agent used in the defluoridation process is not particularly limited and a general reducing agent is used. As a reducing agent, for example, there can be provided Group 1 elements such as lithium, sodium, potassium, rubidium and cesium; Group 2 elements such as beryllium, magnesium, calcium, strontium and barium; Group 3 elements such as scandium, yttrium and lanthanoids; Group 4 elements such as titanium, zirconium and hafnium; Group 5 elements such as vanadium, niobium and tantalum; Group 6 elements such as chromium, molybdenum and tungsten; Group 7 elements such as manganese and rhenium; Group 8 elements such as iron, ruthenium and osmium; Group 9 elements such as cobalt, rhodium and iridium; Group 10 elements such as nickel, palladium and platinum; Group 11 elements such as copper, silver and gold; Group 12 elements such as zinc, cadmium and mercury; Group 13 elements such as boron, aluminum, indium, gallium and thallium; Group 14 elements such as carbon, silicon, germanium, tin and lead; Group 15 elements such as phosphorus, arsenic, antimony and bismuth; Group 16 elements such as sulfur, selenium and tellurium; sodium oxalate; activated carbon; and samarium iodide, and it is preferably zinc, iron, copper, nickel or palladium, more preferably zinc. One of these reducing agents may be singularly used or the plural reducing agents may be used in combination. When zinc is used, the quantity of the used zinc is 6.0 equivalents or more and 200 equivalents or less, preferably 50 equivalents or more and 100 equivalents or less, to the quantity of the raw materials. It is preferable to carry out the defluoridation reaction under atmosphere of an inert gas such as nitrogen, helium, neon, and argon, or under vacuum. The reaction temperature is 0° C. or higher and 600° C. or lower, preferably 200° C. or higher and 300° C. or lower. The reaction time is preferably 2 hours or longer and 24 hours or shorter. The defluoridation process may be carried out using only the raw materials and the reducing agent or another substance may coexist in the reaction system. As another substance coexisting in the reaction system, a substance which acts as a solvent or a catalyst can be selected. For example, the raw materials may be reacted with samarium iodide, zinc, sodium-benzophenone, or the combination thereof in an organic solvent. As an organic solvent, for example, N,N-diethylformamide and tetrahydrofuran can be provided. After the completion of the defluoridation reaction, the objective compound (5) can be obtained by conducting a common post-treatment and subsequently performing purification. As a purification method, a conventional publicly-known method can be used in which solvent extraction, recrystallization and sublimation are included.

Next, as an example of a synthesis method for a fluorinated acene compound, a synthesis method for dodecafluoronaphthacene is described in more detail.

First, as shown in scheme 4,

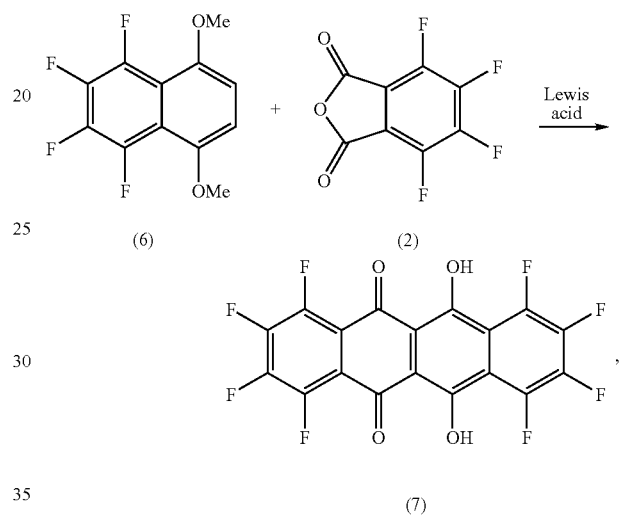

compound (6) is reacted with compound (2) under the presence of a Lewis acid so as to obtain compound (7). That is, 1,2,3,4-tetrafluoro-5,8-dimethoxynaphthalene (6) is reacted with 4,5,6,7-tetrafluoroisobenzfuran-1,3-dione (2) under the presence of a Lewis acid so as to obtain 1,2,3,4,7,8,9,10-octafluoro-6,11-dihydroxynaphthacene-5,12-dione (7). Additionally, the Lewis acid may be used in combination with sodium chloride.

The Lewis acid used in scheme 4 is not particularly limited and, for example, aluminum chloride, zinc chloride, iron (III) chloride, tin (IV) chloride and a boron trifluoride ether complex can be used, and aluminum chloride is preferable. The quantity of the used Lewis acid is 0.1 equivalents or more and 5.0 equivalents or less, preferably 0.2 equivalents or more and 5.0 equivalents or less, to the quantity of the raw materials. When sodium chloride is used with the Lewis acid, the quantity of the used sodium chloride is 0.1 equivalents or more and 10.0 equivalents or less, preferably 5.0 equivalents or more and 7.0 equivalents or less, to the quantity of the raw materials. The quantity of the used compound (2) is 1.0 equivalent or more and 5.0 equivalents or less, preferably 1.1 equivalents or more and 2.0 equivalents or less, to the quantity of the compound (6). The reaction temperature is 0° C. or higher and 320° C. or lower, preferably 200° C. or higher and 300° C. or lower. The reaction time is preferably 1 hour or longer and 10 hours or shorter. After the completion of the reaction, the objective compound (7) can be obtained by conducting a common post-treatment and performing purification.

Next, as shown in scheme 5,

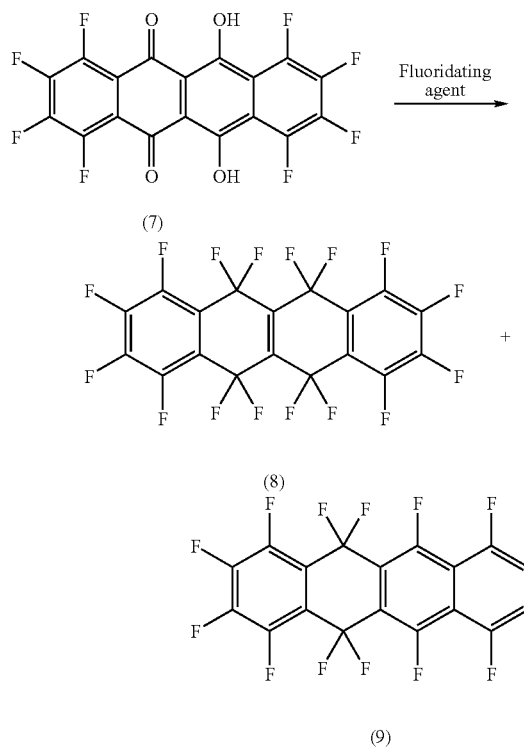

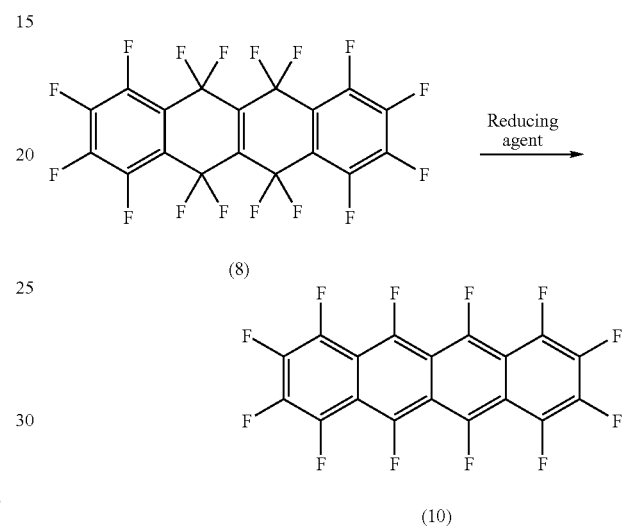

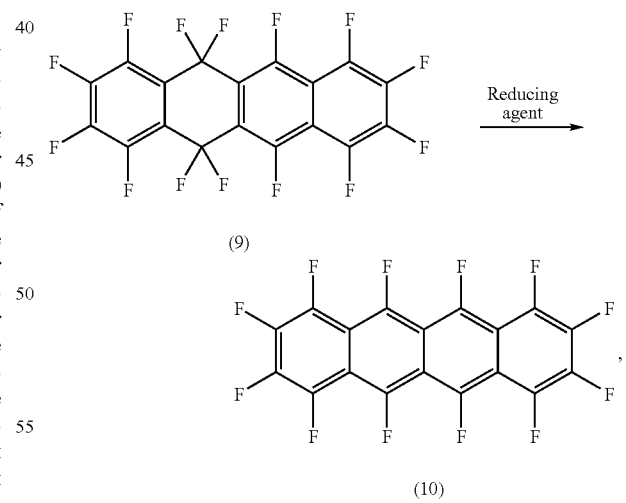

compound (7) is reacted with a fluoridating agent so that it is fluoridated so as to obtain compound (8) and compound (9). That is, 1,2,3,4,7,8,9,10-octafluoro-6,11-dihydroxynaphthacene-5,12-dione (7) is reacted with a fluoridating agent so as to obtain 1,2,3,4,5,5,6,6,7,8,9,10,11,11,12,12-hexadecafluoro-5,6,11,12-tetrahydronaphthacene (8) and 1,2,3,4,5,5,6,7,8,9,10,11,12,12-tetradecafluoro-5,12-dihydronaphthacene (9).

The fluoridating agent used in scheme 5 is not particularly limited and each kind of fluoride can be used, and it is preferably a fluoride of a Group 15 element or a Group 16 element, more preferably sulfur tetrafluoride. The preferable quantity of the used sulfur tetrafluoride is 4.0 times or greater and 30.0 times or less, preferably 10 times or greater and 20 times or less, of the mole quantity of the raw materials. One of these fluoridating agents may be singularly used and the plural fluoridating agents may be used in combination. For example, a mixture of sulfur tetrafluoride and hydrogen fluoride can be used. When the reaction is carried out under pressure, hydrogen fluoride also acts as a solvent. In the fluoridation process, only the raw materials and the fluoridating agent may be used or another substance may coexist in the reaction system. As another substance coexisting in the reaction system, a substance which acts as a solvent or a catalyst can be selected. The substance acting as a solvent is not particularly limited except that it is a substance which is liquid under the reaction condition(s), and hydrogen fluoride and a fluorine-containing solvent such as dichloromethane and chloroform can be provided. When hydrogen fluoride is used, the quantity of the used hydrogen fluoride is preferably 1 mL or more and 20 mL or less to 1 g of the raw materials. The fluoridation process may be carried out at a normal pressure but, when the reaction system is heated, it is preferable to perform heating under pressure. Preferably, the reaction pressure is in a range of 0 MPa or higher and 20 MPa or lower, the reaction temperature is in a range of −40° C. or higher and 320° C. or lower, and the reaction time is in a range of 2 hours or longer and 150 hours or shorter. After the completion of the fluoridation reaction, the objective compounds (8) and (9) can be obtained by conducting a common post-treatment and subsequently performing purification. As a purification method, a conventional publicly-known method can be used in which solvent extraction, recrystallization and sublimation are included. In scheme 5, the objective compounds (8) and (9) can be obtained by performing sublimation under vacuum.

Finally, as shown in scheme 6 and scheme 7, compounds (8) and/or (9) are/is reacted with a reducing agent so as to obtain compound (10). That is, as shown in scheme 6, 1,2,3,4,5,5,6,6,7,8,9,10,11,11,12,12-hexadecafluoro-5,6,11, 12-tetrahydronaphthacene (8) is reacted with a reducing agent so that it is partially defluoridated so as to obtain dodecafluoronaphthacene (10). Also, s shown in scheme 7, 1,2,3, 4,5,5,6,7,8,9,10,11,12,12-tetradecafluoro-5,12-dihydronaphthacene (9) is reacted with a reducing agent so that it is partially defluoridated so as to obtain dodecafluoronaphthacene (10).

Additionally, in the case of performing a defluoridation process, purified materials of the compounds (8) and (9) as raw materials may be used or an unpurified mixture may be used. Specifically, after compound (6) and a reaction mixture obtained by the reaction of sulfur tetrafluoride(1,2,3,4,5,5,6,6,7,8,9,10,11,11,12,12-hexadecafluoro-5,6,11,12-tetrahydronaphthacene (8) and 1,2,3,4,5,5,6,7,8,9,10,11,12,12-tetradecafluoro-5,12-dihydronaphthacene (9)) are solvent-extracted, extracts may be directly used for the defluoridation process.

The reducing agent used in the defluoridation process is not particularly limited and a general reducing agent is used. As a reducing agent, for example, there can be provided Group 1 elements such as lithium, sodium, potassium, rubidium and cesium; Group 2 elements such as beryllium, magnesium, calcium, strontium and barium; Group 3 elements such as scandium, yttrium and lanthanoids; Group 4 elements such as titanium, zirconium and hafnium; Group 5 elements such as vanadium, niobium and tantalum; Group 6 elements such as chromium, molybdenum and tungsten; Group 7 elements such as manganese and rhenium; Group 8 elements such as iron, ruthenium and osmium; Group 9 elements such as cobalt, rhodium and iridium; Group 10 elements such as nickel, palladium and platinum; Group 11 elements such as copper, silver and gold; Group 12 elements such as zinc, cadmium and mercury; Group 13 elements such as boron, aluminum, indium, gallium and thallium; Group 14 elements such as carbon, silicon, germanium, tin and lead; Group 15 elements such as phosphorus, arsenic, antimony and bismuth; Group 16 elements such as sulfur, selenium and tellurium; sodium oxalate; activated carbon; and samarium iodide, and it is preferably zinc, iron, copper, nickel or palladium, more preferably zinc. One of these reducing agents may be singularly used or the plural reducing agents may be used in combination. When zinc is used, the quantity of the used zinc is 6.0 equivalents or more and 200 equivalents or less, preferably 50 equivalents or more and 100 equivalents or less, to the quantity of the raw materials. It is preferable to carry out the defluoridation reaction under atmosphere of an inert gas such as nitrogen, helium, neon, and argon, or under vacuum. The reaction temperature is 0° C. or higher and 600° C. or lower, preferably 200° C. or higher and 300° C. or lower. The reaction time is preferably 2 hours or longer and 24 hours or shorter. The defluoridation process may be carried out using only the raw materials and the reducing agent or another substance may coexist in the reaction system. As another substance coexisting in the reaction system, a substance which acts as a solvent or a catalyst can be selected. For example, the raw materials may be reacted with samarium iodide, zinc, sodium-benzophenone, or the combination thereof in an organic solvent. As an organic solvent, for example, N,N-diethylformamide and tetrahydrofuran can be provided. After the completion of the defluoridation reaction, the objective compound (10) can be obtained by conducting a common post-treatment and subsequently performing purification. As a purification method, a conventional publicly-known method can be used in which solvent extraction, recrystallization and sublimation are included.

Next, an organic thin-film device according to the present invention is described. The organic thin-film device according to the present invention includes an organic thin-film transistor according to the present invention, that is, an organic thin-film transistor having an organic semiconductor layer containing a fluorinated acene compound. Therefore, according to the present invention, an organic thin-film device which includes an organic thin-film transistor having a high carrier-mobility can be provided.

Preferably, an organic thin-film device according to the present invention has an organic thin-film transistor according to the present invention which is configured as an n-type thin-film transistor and a p-type thin-film transistor. That is, the organic thin-film device according to the present invention has the n-type thin-film transistor and the p-type thin-film transistor, wherein the n-type thin-film transistor has an organic semiconductor layer containing a fluorinated acene compound. In this case, various organic thin-film devices can be provided which include an n-type organic thin-film transistor having a high electron-mobility and a p-type thin-film transistor. For example, an n-type thin-film transistor having an organic semiconductor layer containing a fluorinated acene compound and a p-type thin-film transistor are connected to each other so that various logic elements or switching elements can be formed. As such a logic element, for example, there can be provided publicly-known logic elements such as an inverter circuit in which one n-type thin-film transistor and one p-type thin-film transistor are connected in series, a NAND circuit which is composed of two n-type thin-film transistors in series and two p-type thin-film transistors in parallel, and a NOR circuit which is composed of two n-type thin-film transistors in parallel and two p-type thin-film transistors in series. Also, as a switching element, there can be provided a publicly-known switching element such as an inverter circuit in which one n-type thin-film transistor and one p-type thin-film transistor are connected in series, etc.

Also, a p-type thin-film transistor included in an organic thin-film device according to the present invention preferably has an organic semiconductor layer containing pentacene. In this case, since the organic thin-film device has an n-type thin-film transistor which has an organic semiconductor layer containing a fluorinated acene compound and a p-type thin-film transistor which has an organic semiconductor layer containing pentacene, a high-performance organic thin-film device can be provided by using an n-type organic thin-film transistor having a high electron-mobility and a p-type thin-film transistor having a high hole-mobility. That is, as described above, various high-performance logic elements and switching elements can be formed by connecting the n-type thin-film transistor which has an organic semiconductor layer containing a fluorinated acene compound and the p-type thin-film transistor which has an organic semiconductor layer containing pentacene to each other.

PRACTICAL EXAMPLE 1

{1} Synthesis of tetradecafluoropentacene

First, tetradecafluoropentacene was synthesized by the following procedures.

{1-1} First, 1,2,3,4,8,9,10,11-octafluoro-5,7,12,14-tetrahydroxypentacene-6,13-dione (3) was synthesized from 5,6,7,8-tetrafluoro-9,10-dihydroxy-2,3-dihydroanthracene-1,4-dione (1) and 4,5,6,7-tetrafluoroisobenzofuran-1,3-dione (2).

5,6,7,8-tetrafluoro-9,10-dihydroxy-2,3-dihydroanthracene-1,4-dione (1) (9.84 g, 31.3 mmol), 4,5,6,7-tetrafluoroisobenzofuran-1,3-dione (2) (5.75 g, 26.1 mmol), aluminum chloride (1.53 g, 11.5 mmol), and sodium chloride (10.0 g, 171 mmol) were thrown into a 200 mL autoclave made of SUS and heating was made at 280° C. for 1 hour. After the completion of the reaction, cooling was made down to room temperature, the reaction mixture was poured into dilute hydrochloric acid, and stirring was made at 100° C. for 1 hour. Subsequently, the mixture was filtered and the residue was washed with methanol, dichloromethane, toluene and ether in order. The obtained solid was vacuum-dried so as to obtain 11.5 g (yield of 85%) of 1,2,3,4,8,9,10,11-octafluoro-5,7,12, 14-tetrahydroxypentacene-6,13-dione (3).

Melting point: 300° C. (decomposition)
Mass spectrometry (MS m/z) 516 (M$^+$, 100), 258 (29)
Elemental analysis
Calculated values for $C_{22}H_4F_8O_6$: C, 51.18, H, 0.78
Found values: C, 51.40, H, 1.07

{1-2} Next, 1,2,3,4,5,5,6,6,7,7,8,9,10,11,12,12,13,13,14,14-icosafluoro-5,6,7,12,13,14-hexahydropentacene (4) was synthesized from the obtained 1,2,3,4,8,9,10,11-octafluoro-5,7,12,14-tetrahydroxypentacene-6,13-dione (3).

The obtained 1,2,3,4,8,9,10,11-octafluoro-5,7,12,14-tetrahydroxypentacene-6,13-dione (3) (5 g, 9.68 mmol) was thrown into a 500 mL autoclave made of SUS, the container was cooled down to −78° C., hydrogen fluoride (100 g) was added, and, continuously, sulfur tetrafluoride (25 g, 231 mmol) was added. Subsequently, the mixture was heated up to 150° C. on the condition of sealing the reactor. At this time, the pressure in the reactor reached at 4.0 MPa (gage pressure). After the reaction was made for 96 hours, the reactor was gradually cooled down to room temperature and a low boiling point compound was slowly disposed to an exclusion device. When the internal pressure reached at normal pressure, nitrogen was introduced into the container so that all the remaining hydrogen fluoride was removed. Afterward, the reaction product (6.6 g) was extracted with 600 mL of heated chloroform and filtered and, subsequently, the solution was concentrated so as to obtain 4.8 g of a crude product of compound (4). This was recrystallized in chloroform, so as to obtain 2.5 g (3.87 mmol, yield of 40%) of a purified compound (4).

Melting point: 267-269° C.
$^{19}F$ NMR (188 MHz, solvent: $CDCl_3$, reference material: $C_6F_6$)
δ 70.91-70.73 (m, 8F), 61.64-64.46 (m, 4F), 25.86-25.66 (m, 4F), 16.70 (d, J=12.8 Hz, 4F)
Mass spectrometry (MS m/z): 644 (M$^+$, 100), 625 (M$^+$—F, 32), 575 (M$^+$—$CF_3$, 77.2)
Elemental analysis
Calculated values for $C_{22}F_{20}$: C, 41.02
Found values: C, 40.96

{1-3} Finally, tetradecafluoropentacene was synthesized from the obtained 1,2,3,4,5,5,6,6,7,7,8,9,10,11,12,12,13,13,14,14-icosafluoro-5,6,7,12,13,14-hexahydropentacene (4).

A mixture of the obtained 1,2,3,4,5,5,6,6,7,7,8,9,10,11,12,12,13,13,14,14-icosafluoro-5,6,7,12,13,14-hexahydropentacene (4) (1.23 g, 1.91 mmol) and zinc (10.8 g, 165 mmol) was put into a glass tube (length of 100 mm, outer diameter of 26 mm), and the tube was sealed under vacuum and heated at 230° C. for 30 minutes and continuously at 280° C. for 3 hours. The reaction mixture in 20% hydrochloric acid was stirred for 8 hours. The obtained suspension was filtered and the residual solid was washed with a dilute hydrochloric acid, water and methanol in order, so as to obtain a dark blue solid. The obtained solid was sublimed at 280° C. under vacuum so as to obtain 663 mg (1.25 mmol, yield of 65%) of tetradecafluoropentacene (5).

Mass spectrometry (MS m/z): 530 (M$^+$, 100), 499 (M$^+$—CF, 25), 265 (51)
Elemental analysis
Calculated values for $C_{22}F_{14}$: C, 49.84
Found values: C, 49.56

Additionally, in the above-mentioned synthesis of tetradecafluoropentacene, B-540 type of Büchi Company was used for the measurements of melting point. For the NMR, Gemini 200 NMR Spectrometer of Varian Company was used. For the mass spectrometry, GCMS-QP5050A of Shimadzu Corporation was used. For the elemental analysis, CHN coder MT-6 type of Yanaco was used.

{2} Fabrication of an Organic TFT Having an Organic Semiconductor Layer Made of tetradecafluoropentacene As a substrate for an organic TFT, a silicon wafer was used on the surface of which thermally oxidized silicon with a film thickness of 200 nm was formed. Herein, for the silicon wafer, a low resistive silicon wafer was used, and a silicon layer on the substrate also functioned as a gate electrode of the organic TFT. After the substrate was washed with organic solvents such as acetone and isopropyl alcohol, the substrate was further washed by using an ultraviolet-ray-ozone washer. Also, according to need, the substrate was subjected to surface treatment by using octadecyltrichlorosilane (OTS).

Next, the oxidized silicon film on the substrate was used as a gate insulating-film and an organic semiconductor layer made of tetradecafluoropentacene was formed on the oxidized silicon film by means of a vacuum deposition method using tetradecafluoropentacene synthesized in {1}. Herein, the organic semiconductor layer made of tetradecafluoropentacene was formed under the following conditions. The degree of vacuum in a chamber of the apparatus used in regard to the vacuum deposition method was 1×10$^{-4}$ pascals or lower. The temperature of the substrate was in a range of room temperature (24° C.) or higher and 80° C. or lower. The tetradecafluoropentacene purified by means of sublimation was thrown into a crucible made of carbon and the tetradecafluoropentacene was heated by using a tantalum wire filament winding around the crucible. The deposition rate of the organic semiconductor layer was 0.3 angstroms/second or higher and 0.5 angstroms/second or lower and the film thickness was approximately 35 nm.

Finally, gold layers with a film thickness of 50 nm were film-formed on the organic semiconductor layer by means of a vacuum deposition method using a metal-mask, so as to form a source electrode and a drain electrode. Herein, the channel width and channel length of an organic TFT obtained by forming the source electrode and the drain electrode were 50 μm or greater and 200 μm or less, and 1,000 μm, respectively.

Thus, the organic TFT having an organic semiconductor layer made of tetradecafluoropentacene as shown in FIG. 1 could be fabricated.

Figure 2:
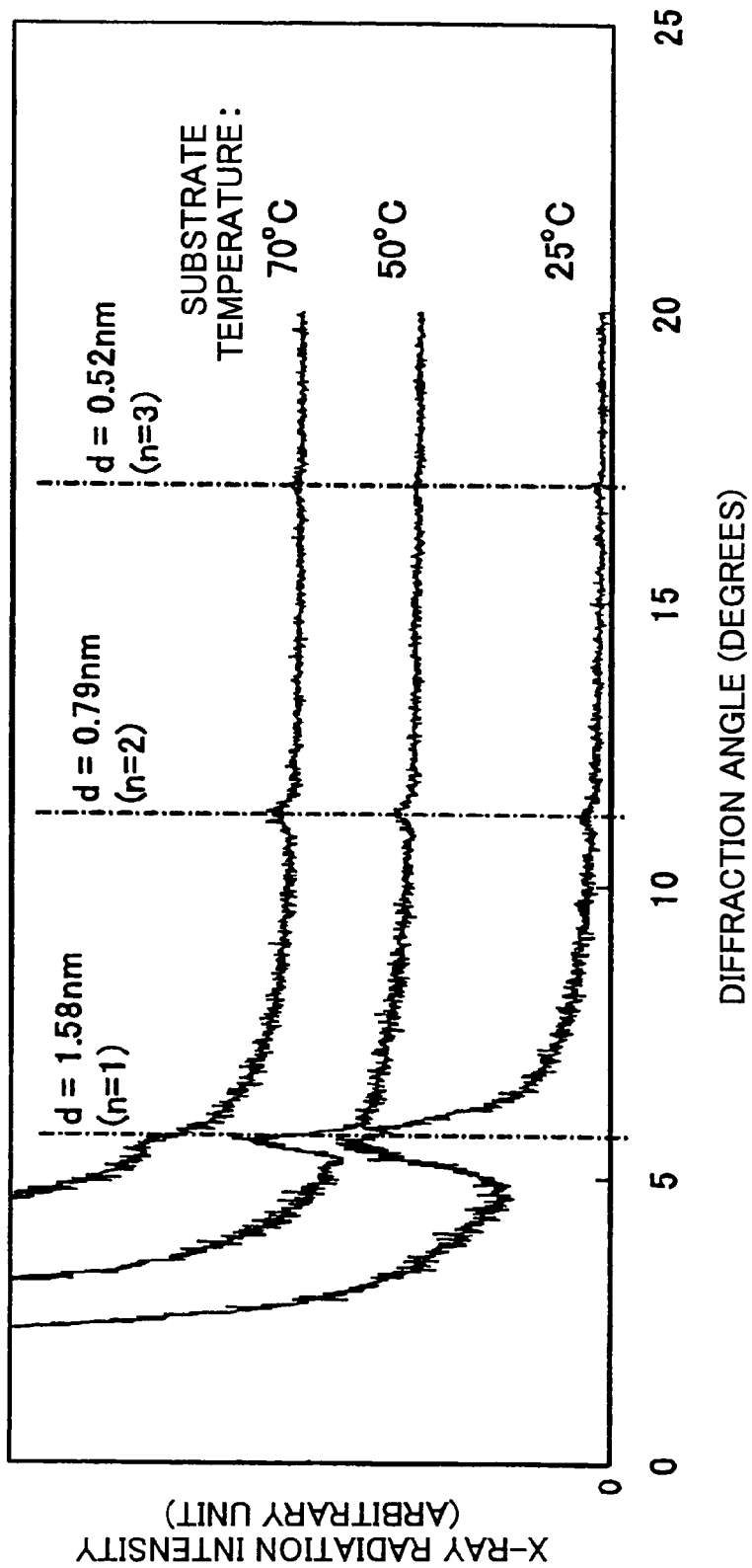
FIG. 2 is a diagram showing an X-ray diffraction pattern of an organic semiconductor layer made of tetradecafluoropentacene in practical example 1.

{3} Measurement for the Organic TFT Having an Organic Semiconductor Layer Made of tetradecafluoropentacene X-ray crystallographic analysis was performed for the organic semiconductor layer made of tetradecafluoropentacene fabricated in {2} was performed. An X-ray diffraction pattern in regard to the organic semiconductor layer made of tetradecafluoropentacene is shown in FIG. 2. Herein, the horizontal axis of FIG. 2 denotes a diffraction angle 2θ of X-rays when the angle of a horizontal direction to the substrate is 0° (wherein θ is an incident angle of the X-ray to the substrate) and the vertical axis denotes intensity of diffracted X-rays. Additionally, the X-ray used for the measurement of an X-ray diffraction pattern was a Cu—Kα line with a wavelength of 5.14 angstroms. Three diffraction patterns in FIG. 2 correspond to substrate temperatures of 25° C., 50° C., and 70° C. when tetradecafluoropentacene was vacuum-deposited, respectively. The primary peak of the X-ray diffraction pattern was obtained at a diffraction angle of 5.6°, the secondary peak was obtained at 11.3°, and the tertiary peak was obtained at 17.0°. Since these diffraction angles corresponded to an intermolecular space of 15.8 angstroms, it could be confirmed that the long axis directions of molecules of tatradecafluoropentacene were oriented along the vertical directions to the surface of the substrate. Such a molecular orientation of tetradecafluoropentacene is preferable, since π-electronic orbitals of the molecules overlap with each other in directions parallel to the surface of the substrate. Accordingly, it is deduced that carriers induced in the organic semiconductor layer can comparatively easily move to the directions parallel to the surface of the substrate. Also, it can be understood that a thin film of tetradecafluoropentacene in which the long axis directions of the molecule are directed to the vertical directions to the surface of the substrate is preferable for an organic semiconductor layer of an organic TFT, since a direction in which the π-electronic orbitals of the molecules of tetradecafluoropenatcene overlap with each other corresponds to the direction of carrier movement from the source electrode to the drain electrode in the organic TFT shown in FIG. 1. Also, it can be understood that the spaces between molecules of tetradecafluoropentacene are comparatively uniform in a thin film of tetradecafluoropentacene fabricated by controlling the temperature of the substrate to approximately 30° C. or higher and approximately 65° C. or lower, since the peak intensity of the X-ray diffraction pattern is comparatively strong and the peak half-value width is comparatively small.

Figure 3:
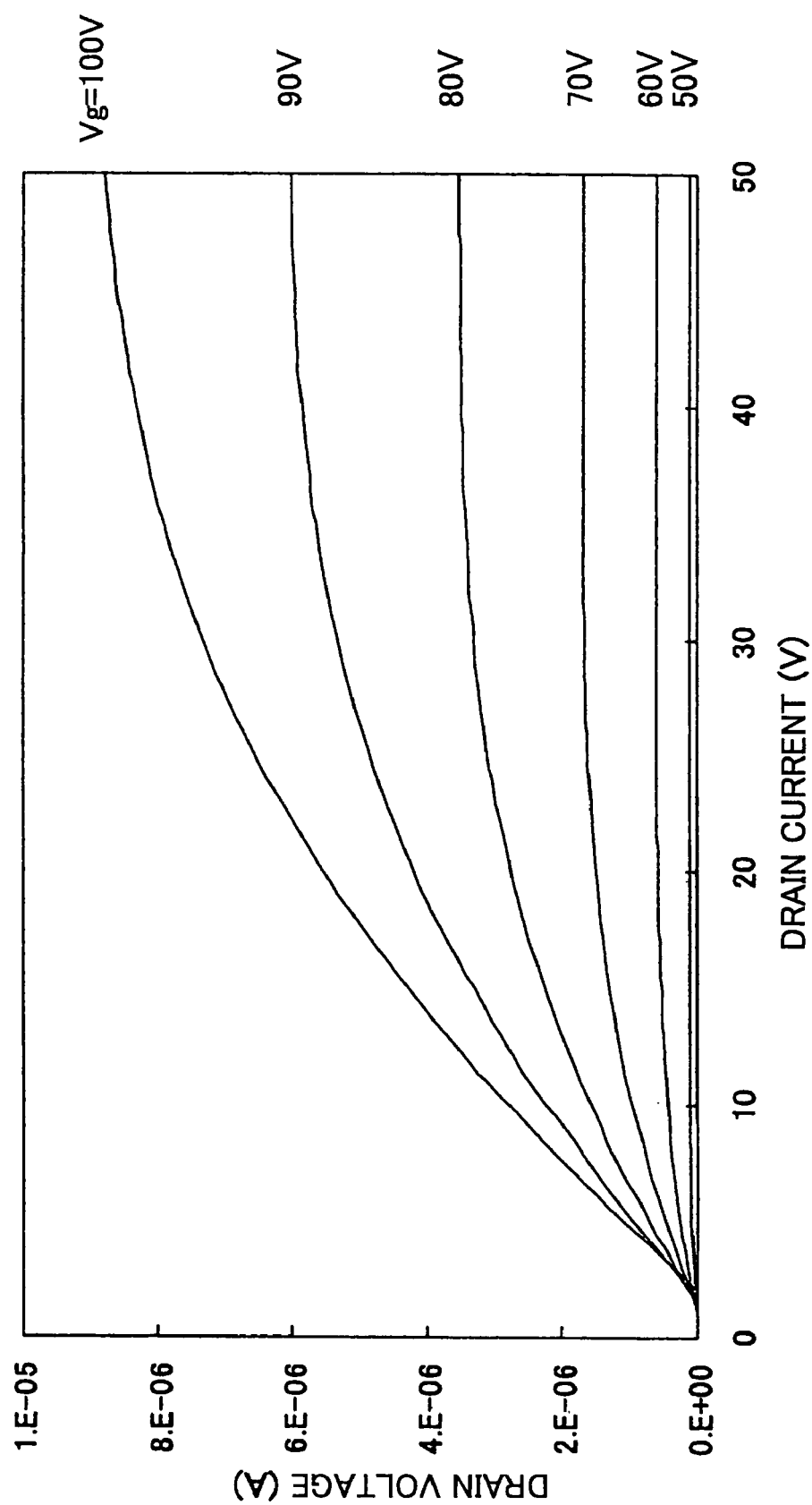
FIG. 3 is a diagram showing the electric characteristics of an organic TFT having an organic semiconductor layer made of tetradecafluoropentacene in practical example 1.

Next, the electrical characteristics of the organic TFT having an organic semiconductor layer made of tetradecafluoropentacene fabricated in {2} are shown in FIG. 3. Herein, the horizontal axis of FIG. 3 denotes a drain voltage (V) and the vertical axis denotes a drain current (A). A change in the drain current versus the drain voltage depends on a gate voltage $V_g$ (V). For each gate voltage, a curve in regard to the change in the drain current versus the drain voltage has a linear region (voltage-proportional region) for low drain voltages and a saturation region for high drain voltages. In addition, when a positive gate voltage applied to the gate electrode is increased, a positive drain current is also increased, and, therefore, it can be confirmed that the organic TFT having an organic semiconductor layer made of tetradecafluoropentacene fabricated in {2} was an n-type organic TFT. Further, the field-effect mobility μ of carrier of the organic TFT can be calculated by using a formula $$Id=(W/2L)\mu Ci(V_g-V_t)^2 \quad (A)$$

which represents a drain current Id in a saturation region of the electrical characteristics of an organic TFT. Herein, L and W are the gate length and gate width of the organic TFT, respectively, Ci is a capacitance per unit surface area of the gate insulating film, $V_g$ is a gate voltage and $V_t$ is a threshold voltage of the gate voltage. The field-effect mobility of carrier of the organic TFT having an organic semiconductor layer made of tetradecafluoropentacene fabricated in {2} was calculated by using the formula (A) and, as a result, the field-effect mobility of carrier of the organic TFT having an organic semiconductor layer made of tetradecafluoropentacene fabricated at a substrate temperature of 50° C. was 0.1 cm²/Vs.

PRACTICAL EXAMPLE 2

{1} Synthesis of dodecafluoronaphthacene

First, dodecafluoronaphthacene was synthesized by the following procedures.

{1-1} First, 1,2,3,4,7,8,9,10-octafluoro-6,11-tetrahydroxynaphthacene-5,12-dione (7) was synthesized from 1,2,3,4-tetrafluoro-5,8-dimethoxynaphthalene (6) and 4,5,6,7-tetrafluoroisobenzofuran-1,3-dione (2).

1,2,3,4-tetrafluoro-5,8-dimethoxynaphthalene (6) (4.77 g, 18.3 mmol), 4,5,6,7-tetrafluoroisobenzofuran-1,3-dione (2) (4.77 g, 21.7 mmol), aluminum chloride (23.1 g, 173 mmol), and sodium chloride (3.56 g, 60.9 mmol) were thrown into a 200 mL autoclave and heating was made at 200° C. for 1 hour. After the completion of the reaction, cooling was made down to room temperature, the reaction mixture was poured into dilute hydrochloric acid, and stirring was made at 100° C. for 1 hour. Subsequently, the mixture was filtered and the residue was washed with water, methanol and ether in order. The obtained solid was recrystallized from dichloromethane so as to obtain 6.3 g (yield of 79%) of 1,2,3,4,7,8,9,10,-octafluoro-6,11-dihydroxynaphthacene-5,12-dione (7).

Melting point: 300° C. (decomposition)
Mass spectrometry (MS m/z): 434 (M⁺, 100)
Elemental analysis
Calculated values for $C_{18}H_2F_8O_4$: C, 49.79, H, 0.49
Found values: C, 49.81, H, 0.57.

{1-2-1} Further to {1-1}, 1,2,3,4,5,5,6,6,7,8,9,10,11,11,12,12-hexadecafluoro-5,6,11,12-tetrahydronaphthacene (8) was synthesized from the obtained 1,2,3,4,7,8,9,10-octafluoro-6,11-dihydroxynaphthacene-5,12-dione (7).

The obtained 1,2,3,4,7,8,9,10-octafluoro-6,11-dihydroxynaphthacene-5,12-dione (7) (1 g, 2.3 mmol) was thrown into a 200 mL autoclave made of SUS, the container was cooled down to −78° C., hydrogen fluoride (56 g) was added, and, continuously, sulfur tetrafluoride (6.9 g, 64 mmol) was added. Subsequently, heating up to 150° C. was made on the condition of sealing the reactor. At this time, the pressure in the reactor reached at 3.2 MPa (gage pressure). After the reaction was made for 24 hours, the reactor was gradually cooled down to room temperature and a low boiling point compound was slowly disposed to an exclusion device. When the internal pressure reached at normal pressure, nitrogen was introduced into the container so that all the remaining hydrogen fluoride was removed, whereby 1.2 g of a mixture of 1,2,3,4,5,5,6,6,7,8,9,10,11,11,12,12-hexadecafluoro-5,6,11,12-tetrahydronaphthacene (8) and a high boiling point product ((8): the high boiling point product=70:30 (result of mass spectrometry)) was obtained. Afterward, the reaction product was purified by means of sublimation so as to obtain 0.425 g (0.82 mmol, yield of 36%) of a purified (8).

Melting point: 179-183° C.
¹⁹F NMR (188 MHz, solvent: CDCl₃, reference material: C₆F₆)
δ 71.90-71.78 (m, 8F), 25.64-25.44 (m, 4F), 16.30 (d, J=12.4 Hz, 4F)
Mass spectrometry (MS m/z): 520 (M⁺, 93), 501 (M⁺—F, 40), 451 (M⁺—CF₃, 100), 432 (29), 413 (47.2), 401 (43), 382 (80)
Elemental analysis
Calculated values for $C_{18}F_{16}$: C, 41.56
Found values: C, 41.22.

{1-2-2} Further to {1-1}, 1,2,3,4,5,5,6,6,7,8,9,10,11,11,12,12-hexadecafluoro-5,6,11,12-tetrahydronaphthacene (8) and 1,2,3,4,5,5,6,7,8,9,10,11,12,12-tetradecafluoro-5,12-dihydronaphthacene (9) were synthesized from the obtained 1,2,3,4,7,8,9,10-octafluoro-6,11-dihydroxynaphthacene-5,12-dione (7).

The obtained 1,2,3,4,7,8,9,10-octafluoro-6,11-dihydroxynaphthacene-5,12-dione (7) (1 g, 2.3 mmol) was thrown into a 200 mL autoclave made of SUS, the container was cooled down to −78° C., hydrogen fluoride (56 g) was added, and, continuously, sulfur tetrafluoride (5.4 g, 50 mmol) was added. Subsequently, heating up to 150° C. was made on the condition of sealing the reactor. At this time, the pressure in the reactor reached at 3.4 MPa (gage pressure). After the reaction was made for 4 hours, the reactor was gradually cooled down to room temperature and a low boiling point compound was slowly disposed to an exclusion device. When the internal pressure reached at normal pressure, nitrogen was introduced into the container so that all the remaining hydrogen fluoride was removed, whereby 1.1 g of a mixture of 1,2,3,4,5,5,6,6, 7,8,9,10,11,11,12,12-hexadecafluoro-5,6,11,12-tetrahydronaphthacene (8), 1,2,3,4,5,5,6,7,8,9,10,11,12,12-tetradecafluoro-5,12-dihydronaphthacene (9) and a high boiling point product ((8):(9): the high boiling point product=47:47:6 (result of mass spectrometry)) was obtained.

Mass spectrometry for (9) (MS m/z): 482 (M$^+$, 100)

{1-3} Further to {1-2-1}, dodecafluoronaphthacene (10) was synthesized from the obtained 1,2,3,4,5,5,6,6,7,8,9,10, 11,11,12,12-hexadecafluoro-5,6,11,12-tetrahydronaphthacene (8).

A mixture of the obtained 1,2,3,4,5,5,6,6,7,8,9,10,11,11, 12,12-hexadecafluoro-5,6,11,12-tetrahydronaphthacene (8) (426 mg, 0.82 mmol) and zinc (4.3 g, 66 mmol) was put into a glass tube (length of 100 mm, outer diameter of 26 mm), and the tube was sealed under vacuum and heated at 230° C. for 30 minutes and continuously at 280° C. for 3 hours. The reaction mixture was sublimed at 210° C. under vacuum, so as to obtain 197 mg (54%) of dodecafluoronaphthacene (10).

Melting point: 318° C.

$^{19}$F NMR (188 MHz, solvent: CDCl$_3$, reference material: C$_6$F$_6$)

δ 43.30-43.03 (m, 4F), 17.82-17.55 (m, 4F), 9.53-9.36 (m, 4F)

Mass spectrometry (MS m/z): 444 (M$^+$, 100), 413 (M$^+$—CF, 23), 375 (14), 222 (32)

Elemental analysis

Calculated values for C$_{18}$F$_{12}$: C, 48.67

Found values: C, 48.54.

Additionally, in the above-mentioned synthesis of dodecafluoronaphthacene, B-540 type of Büchi Company was used for the measurements of melting point. For the NMR, Gemini 200 NMR Spectrometer of Varian Company was used. For the mass spectrometry, GCMS-QP5050A of Shimadzu Corporation was used. For the elemental analysis, CHN coder MT-6 type of Yanaco was used.

{2} Fabrication of an organic TFT Having an organic Semiconductor Layer made of dodecafluoronaphthacene As a substrate for an organic TFT, a silicon wafer was used on the surface of which thermally oxidized silicon with a film thickness of 200 nm was formed. Herein, for the silicon wafer, a low resistive silicon wafer was used, and a silicon layer on the substrate also functioned as a gate electrode of the organic TFT. After the substrate was washed with organic solvents such as acetone and isopropyl alcohol, the substrate was further washed by using an ultraviolet-ray-ozone washer. Also, according to need, the substrate was subjected to surface treatment by using octadecyltrichlorosilane (OTS).

Next, the oxidized silicon film on the substrate was used as a gate insulating-film and an organic semiconductor layer made of dodecafluoronaphthacene was formed on the oxidized silicon film by means of a vacuum deposition method using dodecafluoronaphthacene synthesized in {1}. Herein, the organic semiconductor layer made of dodecafluoronaphthacene was formed under the following conditions. The degree of vacuum in a chamber of the apparatus used in regard to the vacuum deposition method was 1×10$^{-4}$ pascals or lower. The temperature of the substrate was in a range of room temperature (24° C.) or higher and 80° C. or lower. The dodecafluoronaphthacene purified by means of sublimation was thrown into a crucible made of carbon and the dodecafluoronaphthacene was heated by using a tantalum wire filament winding around the crucible. The deposition rate of the organic semiconductor layer was 0.3 angstroms/second or higher and 0.5 angstroms/second or lower and the film thickness was approximately 35 nm.

Finally, gold layers with a film thickness of 50 nm were film-formed on the organic semiconductor layer by means of a vacuum deposition method using a metal-mask, so as to form a source electrode and a drain electrode. Herein, the channel width and channel length of an organic TFT obtained by forming the source electrode and the drain electrode were 50 μm or greater and 200 μm or less, and 1,000 μm, respectively.

Thus, the organic TFT having an organic semiconductor layer made of dodecafluoronaphthacene as shown in FIG. 1 could be fabricated.

{3} Measurement for the organic TFT Having an organic Semiconductor Layer Made of dodecafluoronaphthacene X-ray crystallographic analysis was performed for the organic semiconductor layer made of dodecafluoronaphthacene fabricated in {2} was performed. The X-ray used for the measurement of an X-ray diffraction pattern was a Cu—Kα line with a wavelength of 5.14 angstroms. As an X-ray diffraction pattern obtained for the organic semiconductor layer made of dodecafluoronaphthacene, the primary, secondary and tertiary peaks were observed which correspond to an intermolecular space of 13 angstroms. Based on the X-ray diffraction pattern corresponding to an intermolecular space of 13 angstroms, it could be confirmed that the long axis directions of molecules of dodecafluoronaphthacene were oriented along the vertical directions to the surface of the substrate. Such a molecular orientation of dodecafluoronaphthacene is preferable, since π-electronic orbitals of the molecules overlap with each other in directions parallel to the surface of the substrate. Accordingly, it is deduced that carriers induced in the organic semiconductor layer can comparatively easily move to the directions parallel to the surface of the substrate. Also, it can be understood that a thin film of dodecafluoronaphthacene in which the long axis directions of the molecule are directed to the vertical directions to the surface of the substrate is preferable for an organic semiconductor layer of an organic TET, since a direction in which the π-electronic orbitals of the molecules of dodecafluoronaphthacene overlap with each other corresponds to the direction of carrier movement from the source electrode to the drain electrode in the organic TFT shown in FIG. 1. Also, it can be understood that the spaces between molecules of dodecafluoronaphthacene are comparatively uniform in a thin film of dodecafluoronaphthacene fabricated by controlling the temperature of the substrate to approximately 24° C. or higher and approximately 60° C. or lower, since the peak intensity of the X-ray diffraction pattern is comparatively strong and the peak half-value width is comparatively small.

Next, the electrical characteristics of the organic TFT having an organic semiconductor layer made of dodecafluoronaphthacene fabricated in {2} were measured. As a result, at a gate voltage, a curve in regard to the change in the drain current versus the drain voltage was good and had a linear region (voltage-proportional region) for low drain voltages and a saturation region for high drain voltages. In addition, when a positive gate voltage applied to the gate electrode was increased, a positive drain current was also increased, and, therefore, it could be confirmed that the organic TFT having an organic semiconductor layer made of dodecafluoronaphthacene fabricated in {2} was an n-type organic TFT. Further, the field-effect mobility μ of carrier of the organic TFT having an organic semiconductor layer made of dodecafluoronaphthacene fabricated in {2} was calculated by using the above formula (A) which represents a drain current Id in a saturation region in regard to the electrical characteristics of an organic TFT and, as a result, the field-effect mobility of carrier of the organic TFT having an organic semiconductor layer made of dodecafluoronaphthacene fabricated at a substrate temperature of 40° C. was 0.01 cm$^2$/Vs.

The embodiments and practical examples of the present invention have been specifically described above, but the present invention is not limited to these embodiments and practical examples and these embodiments and practical examples of the present invention can be modified or altered without departing from the spirit and scope of the present invention.

INDUSTRIAL APPLICABILITY

The present invention can be applied to an organic thin-film transistor having a higher carrier-mobility, a method of fabricating the organic thin-film transistor and an organic thin-film device including the organic thin-film transistor.

The invention claimed is:

1. A method of fabricating an organic thin-film transistor comprising a substrate and an organic semiconductor layer, wherein the organic semiconductor layer is obtained by controlling temperature of the substrate to 30° C. or higher and 65° C. or lower and vacuum-depositing tetradecafluoropentacene ($C_{22}F_{14}$) on the substrate at $1\times10^{-4}$ pascals or lower.

2. A method of fabricating an organic thin-film transistor comprising a substrate and an organic semiconductor layer, wherein the organic semiconductor layer is obtained by controlling temperature of the substrate to 24° C. or higher and 60° C. or lower and vacuum-depositing dodecafluoronaphthacene ($C_{18}F_{12}$) on the substrate at $1\times10^{-4}$ pascals or lower.

3. An organic thin-film transistor comprising a substrate and thin films of gate electrode, gate insulating film, organic semiconductor layer, and source and drain electrodes stacked on the substrate in order, wherein the thin film of organic semiconductor layer is obtained by controlling temperature of the substrate to 24° C. or higher and 60° C. or lower and vacuum-depositing dodecafluoronaphthacene ($C_{18}F_{12}$) on the substrate at $1\times10^{-4}$ pascals or lower.

* * * * *